United States Patent [19]
Mar

[11] Patent Number: 5,822,387
[45] Date of Patent: Oct. 13, 1998

[54] APPARATUS FOR FAST PHASE-LOCKED LOOP (PLL) FREQUENCY SLEWING DURING POWER ON

[75] Inventor: Monte F. Mar, Issaquah, Wash.

[73] Assignee: Cypress Semiconductor Corporation, San Jose, Calif.

[21] Appl. No.: 622,531

[22] Filed: Mar. 25, 1996

[51] Int. Cl.⁶ ................................................. H04L 7/00
[52] U.S. Cl. ........................ 375/376; 375/375; 375/374
[58] Field of Search .................... 375/375, 376, 375/377, 374, 373; 327/156, 157, 162, 147, 148

[56] References Cited

U.S. PATENT DOCUMENTS

| | | | |
|---|---|---|---|
| 3,795,870 | 3/1974 | Sanders | 331/1 A |
| 4,829,258 | 5/1989 | Volk et al. | 375/376 |
| 4,931,748 | 6/1990 | McDermott et al. | 331/1 A |
| 5,008,635 | 4/1991 | Hanke et al. | 331/1 A |

OTHER PUBLICATIONS

Shariatdoust et al. (AT&T Bell Laboratories), IEEE 1992 Custom Integrated Circuits Conference, pp. 24.2.1–24.2.5.
Alvarez et al., 1994 Symposium on VLSI Circuits Digest of Technical Papers, pp. 37–38.

*Primary Examiner*—Tesfaldet Bocure
*Attorney, Agent, or Firm*—Dykema Gossett PLLC

[57] ABSTRACT

A clock synthesizer is disclosed that includes a phase-locked loop circuit having two modes of operation: a non-slewing mode of operation, and a frequency-slewing mode of operation. During the power-up of the system, the PLL is controlled to operate in the non-slewing mode of operation to effect rapid variations in the output frequency. A power-on reset circuit is disclosed which determines when the system is in the power-up interval, and generates a power-on-reset signal to so indicate. The PLL operates in a frequency-slewing mode after power-up to provide controlled transitions in the frequency of the output reference signal of the PLL. A phase-locked loop circuit having structure to implement both modes is provided, as well as an adjustable lock detector circuit. The output of the lock detector, a logical lock signal, is used to enable the frequency-slewing mode of the PLL circuit. During power-up, the power-on-reset signal is deasserted, and disables the lock detector from generating the frequency-slewing mode enable signal. The PLL thus operates in a non-slewing mode during power-up. After the power-on-reset signal has been asserted, the lock detector is permitted to generate the frequency-mode enable signal as soon as the PLL achieves phase lock. Once phase lock has been achieved, the enable signal from the lock detector places the PLL in a frequency-slewing mode. The phase-locked loop circuit includes structure that limits the rate of variation in the frequency of the output reference signal, as well as limits the UP, and DOWN signals, by way of a reference window signal mechanism, to ensure that the lock detector, after power-up, always detects lock to thereby generate the frequency-slewing mode enable signal.

18 Claims, 4 Drawing Sheets

APPARATUS FOR FAST PHASE-LOCKED LOOP (PLL) FREQUENCY SLEWING DURING POWER ON

BACKGROUND OF THE INVENTION

1. Field of the Invention

The present invention relates to a phase-locked loop circuit, and, more particularly, to an architecture for a PLL that provides for a fast frequency slew rate during power up, and, a second, more controlled frequency slew rate during normal operation.

2. Related Art

Phase-locked loop (PLL) circuits are very important structures, and are used in many applications, such as clock synthesizer devices, communication circuits, and, generally, for many types of frequency synchronization situations. In such applications, the PLL circuit is used to provide an output signal that is phase-locked to an input reference signal. That is, the output signal is substantially of the same frequency, and phase, as the input reference signal. The basic PLL circuit includes three parts: a phase/frequency detector (PFD), a loop filter, usually a low-pass filter, and a voltage-controlled oscillator (VCO). It should be appreciated that a phase detector is an essential part of the PLL; the PFD being a specialized case of a phase detector. In a common configuration, a charge pump is also used. This basic setup is conventional, and is well-known to one of ordinary skill in the art.

The PFD is responsive to two signals: the PLL input reference signal, and the VCO output signal fed back to the PFD (sometimes via a frequency reducing device such as a divider/counter, or the like), (hereinafter the "feedback signal"). When the feedback signal is substantially the same frequency, and phase as the PLL input reference signal, then the PLL circuit is said to be phase-locked. In this condition, two outputs of the PFD, namely, an UP, and a DOWN signal, both assume a first state (e.g., a logic low) indicative of this condition. These signals are used to control the charge pump to increase or decrease its output control voltage. However, if the PLL input signal occurs before the feedback signal, indicating that the VCO is running too slowly, the PFD produces the pump UP signal that continues until the rising edge of the feedback signal. Thus, the UP signal is characterized by a pulse width indicative of the phase difference between the input reference signal, and the feedback signal. On the other hand, if the feedback signal to the PFD occurs before the input reference signal, the PFD produces the pump DOWN signal that is triggered on the rising edge of the feedback input, and continues until the rising edge of the PLL input reference signal. The DOWN pulse therefore, is also characterized by a pulse width that is indicative of the phase difference between the input reference signal, and the feedback signal. By way of the foregoing method, the PFD forces the VCO to run faster or slower based on the relationship between the two inputs thereto; namely, the input reference signal, and the feedback signal.

The PLL circuit, such as described above, has been used in constructing a clock synthesizer device, which may provide an output clock having multiple frequencies, depending upon the state of predetermined command inputs. For example, such a change in output frequency has been used to save energy in a laptop computer wherein the standard output frequency, for driving various buses, may be 66 MHZ, and which, when reduced, may be 8 MHZ to conserve energy. It is conventional to effect this change in output frequency in a rather slow, controlled fashion which is referred to as "frequency slewing." During normal operation of such a system, it is advantageous to make the transition time between frequencies relatively long, thus allowing any circuits being driven by the clock to be able to maintain functionality (i.e., maintain lock) without violating system timing. However, since this transition rate is generally set to be fairly slow, it takes a relatively long time to power up such a clock synthesizer. This is because the output frequency must transition from essentially zero frequency output to the normal operating frequency—a large interval to traverse.

While different approaches in the art have attempted to design a PLL that provides a reduced lock time, generally, when a loss-of-lock is sensed, the art has failed to recognize the problem related to providing controlled, frequency slewing during normal operation, but, reducing the long time-to-lock during power up.

Accordingly, there is a need to provide an improved PLL architecture that minimizes or eliminates one or more of the problems as set forth above.

SUMMARY OF THE INVENTION

This invention provides an improved PLL architecture of the type including a non-slewing mode for power up, and a frequency-slewing mode for normal operation. This invention recognizes that the considerations which may apply during normal operation that demand frequency-slewing (e.g., desire to prevent driven circuits from loss-of-lock), do not necessarily apply to a power up phase of operation, since during this phase, many, if not all, of the driven circuits are held in reset (inoperative) anyway. In accordance with this recognition, the solution provides for two different modes of operation for the PLL architecture: a non-slewing mode for power up, and a frequency-slewing mode for the small frequency excursions required during normal operation.

An apparatus in accordance with this invention includes a phase-locked loop (PLL) circuit, a lock detector circuit, and means for switching between the non-slewing and frequency-slewing modes of operation, according to a frequency-slewing enable signal. The PLL circuit responds to an input reference signal and generates an output reference signal locked thereto wherein the PLL includes means for generating an actual out-of-lock indicative signal (UP, and DOWN signals in a preferred, charge-pump embodiment) indicative of the extent to which the PLL is out-of-lock. The structure used to switch between modes responds to the actual out-of-lock signals to generate a gated out-of-lock signal. The gated O.O.L. signal, when in the non-slewing mode of operation, corresponds to the actual out-of-lock indicative signal. When in the frequency-slewing mode of operation, however, the gated O.O.L. signal corresponds to the actual out-of-lock indicative signal modified according to a predetermined strategy so as to limit a rate at which the output reference signal varies.

The lock detector is provided for generating a logical lock signal, which is then used as the frequency-slewing enable signal to the PLL. The enable signal is generated when the gated O.O.L. signal is locked to the input reference signal, within a predetermined error margin. Importantly, the enable signal, which is required to be asserted in order to enter into the frequency-slewing mode, cannot be generated by the lock detector when a disable signal is applied to a disable input of the lock detector. In a preferred embodiment, the disable signal takes the form of a power-on-reset signal provided from a power-on-reset circuit which maintains the disable signal active during a power-up phase of a power supply until the output of the power supply has reached a preselected level. By the foregoing, during power-on, the frequency-slewing mode is disabled, and, accordingly, fast transition to the normal operating frequency is permitted. However, once the power-on-reset (i.e., disable) signal is deasserted, the lock detector is permitted to assert the frequency-slewing enable signal to place the PLL in the frequency-slewing mode.

In a preferred embodiment, the structure for generating the gated out-of-lock indicative signal includes a circuit for generating a reference window signal about the PLL input reference signal. An AND gate is responsive to the UP/DOWN signals (from the PFD) and the window signal for truncating the pulse width of the UP/DOWN signals for any excursion outside of the reference window. In this way, since the UP/DOWN signals control the VCO portion of the PLL, and further, since they are limited, the rate at which the frequency of the output reference signal changes is also thus limited. This occurs during frequency-slewing.

These and other features and objects of this invention will become apparent to one skilled in the art from the following detailed description and the accompanying drawings illustrating features of this invention by way of example.

DETAILED DESCRIPTION OF THE PREFERRED EMBODIMENTS

Figure 1:
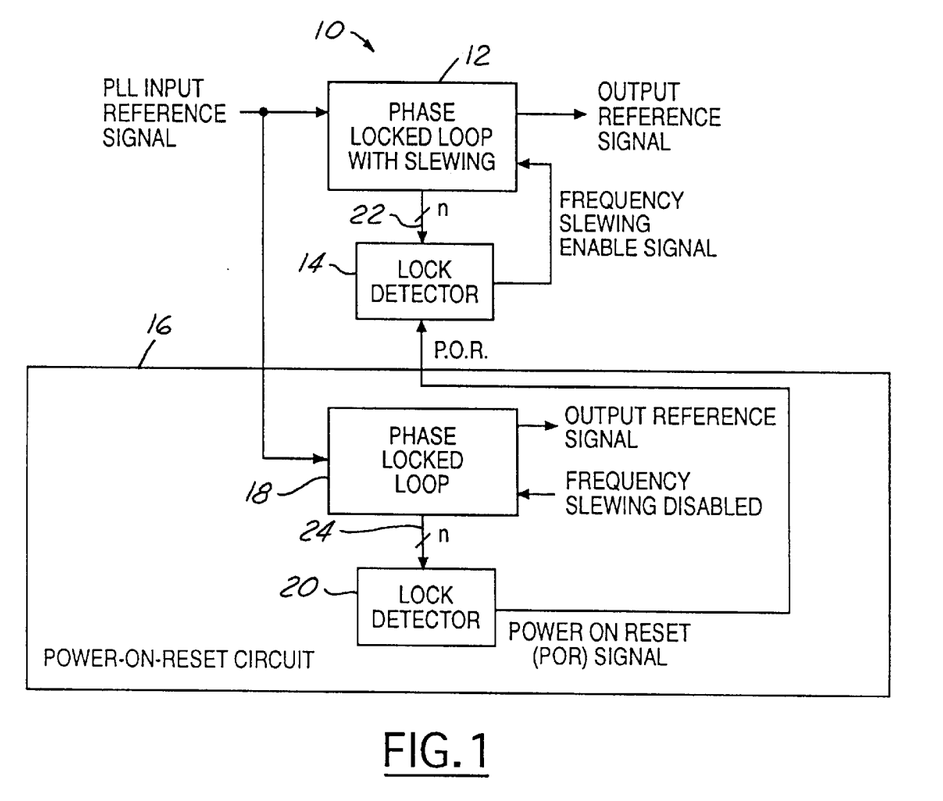
FIG. 1 is a simplified, block diagram view of a preferred clock generator embodiment in which the inventive PLL architecture is employed.

Referring now the drawings wherein like reference numerals are used to identify identical components in the various views, FIG. 1 shows an apparatus, such as a clock synthesizer 10, for generating an output reference signal using an input reference signal, and employing the inventive phase-locked loop (PLL) circuit architecture. In a preferred environment, clock synthesizer 10 is used to provide two distinct modes of operation; namely, a non-frequency slewing mode of operation during power-up for providing a fast PLL lock, and, a frequency-slewing mode during normal operation to provide relatively slow, controlled frequency rate changes to achieve the above-identified object of allowing circuits driven by clock synthesizer 10 to remain locked on the output reference signal generated therefrom.

Clock synthesizer 10 includes a first PLL 12 with selectable frequency-slewing and non-slewing modes of operation, lock detector 14, which may, in a preferred embodiment, be adjustable, and a power-on-reset circuit 16, which includes a phase-locked loop 18, and lock detector 20.

Circuit 12 is responsive to a PLL input reference signal for generating an output reference signal that is phase and frequency locked therewith. PLL 12 includes means for generating an actual out-of-lock indicative signal indicative of the extent to which PLL 12 is out-of-lock. In a preferred charge pump-based embodiment to be described in further detail hereinafter, the actual out-of-lock indicative signal comprises an UP signal indicating that the output reference signal (as fed back to the PFD internally—hereafter the "feedback signal") lags the input reference signal, and a DOWN signal indicating that the feedback signal leads the input reference signal. PLL 12 also includes means for generating a gated out-of-lock indicative signal 22, the functions of which will be described in further detail below. In the preferred charged pump-based embodiment, the signals 22 comprise a gated UP signal, and gated DOWN signal.

Lock detector 14 is provided for generating an active frequency-slewing enable signal when the gated out-of-lock indicative signals 22 indicate that the output reference signal is locked to the input reference signal within a predetermined error margin. Lock detector 14 is operative to generate the frequency-slewing enable signal when the above-mentioned lock conditions are present, and, in addition, when the power-on-reset (POR) signal has been asserted by power-on-reset circuit 16. However, when the POR signal is not asserted, then the output of lock detector 14 is disabled, and is incapable of generating the frequency-slewing enable signal. Accordingly, the POR signal acts as a disable signal for disabling the generation of the enable signal to PLL 12. Lock detector 14 is conventional in the art, and is within the capabilities of one of ordinary skill. For example, U.S. Pat. No. 5,008,635 entitled "PHASE-LOCK-LOOP LOCK INDICATOR CIRCUIT" discloses one structure which may be used for lock detector 14. In one preferred embodiment, an adjustable lock detector is used that includes an adjustable phase error threshold level, as well as other adjustable features, as is disclosed in my copending patent application entitled "AN ADJUSTABLE LOCK DETECTOR FOR A PHASE-LOCKED LOOP CIRCUIT", filed Mar. 25, 1996, assigned to the common assignee of the present invention, and hereby incorporated by reference. It should be appreciated that other structures suitable for use in the present invention may be employed without departing from the spirit and scope of this invention.

Power-on-reset circuit 16 is provided for generating the POR signal during a power-up phase of a system power supply (not shown) until an output of the power supply has reached a preselected level, generally $V_{cc}$, and has stabilized. The power-on-reset circuit is needed because it cannot be guaranteed that lock detector 14 will come up in any specified state. If lock detector 14 powers up indicating lock, frequency-slewing will be enabled in circuit 12, and the desired function of fast power up lock will be defeated. Power-on-reset circuit includes PLL 18, and lock detector 20.

PLL circuit 18 may be a conventional PLL circuit that locks an output reference signal relative to an input reference signal. PLL 18 may be a conventional, well-known type of PLL circuit (i.e., one without the inventive dual mode of operation), or, as illustrated in FIG. 1, may be identical to PLL 12, but with the frequency-slewing mode of operation disabled. PLL 18 generates a second out-of-lock indicative signal 24 indicative of the extent to which the PLL 18 is out-of-lock. In a charge pump-based PLL 18, signals 24 may comprise the above-mentioned UP, and DOWN signals.

Lock detector 20 is provided for generating the POR signal when the out-of-lock indicative signal 24 indicates that PLL 18 is locked to within a second predetermined error margin or window. In particular, due to the desired operating characteristics of having the POR circuit lock first, the acceptable phase error permitted by lock detector 20 before generating the POR signal (i.e., a logical lock signal) is greater than the acceptable phase error associated with lock detector 14. Moreover, the output reference signal associated with PLL 18 is lower in frequency, than the output reference signal associated with PLL 12 (implemented, for example, by using a lower divide-by-device in the feedback path). The combination of having an output reference signal having a lower frequency, and a lock detector 20 having a larger, acceptable phase error margin, permits the power-on-reset circuit 16 to lock and generate the POR signal more quickly than could lock detector 14.

Figure 2A:
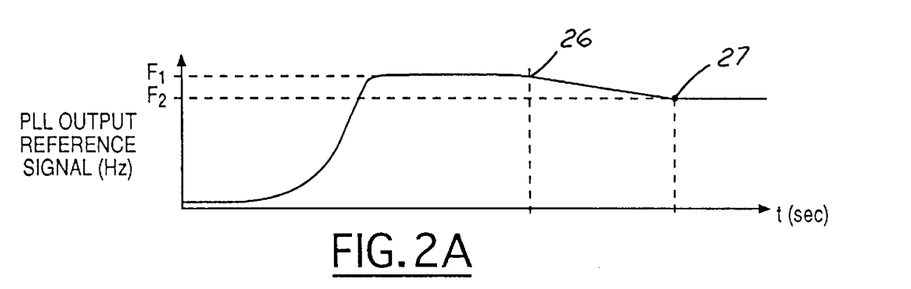
FIGS. 2A–2E are simplified, timing diagram views illustrating the control of the PLL output signal established by the present invention.
Figure 2B:
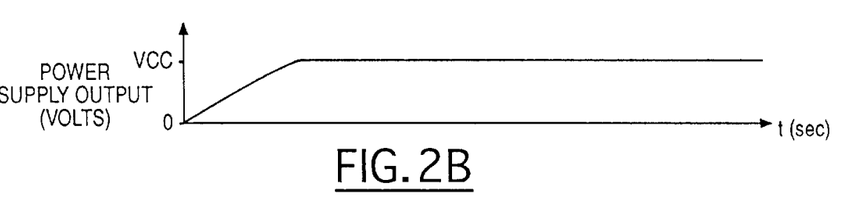
Figure 2C:
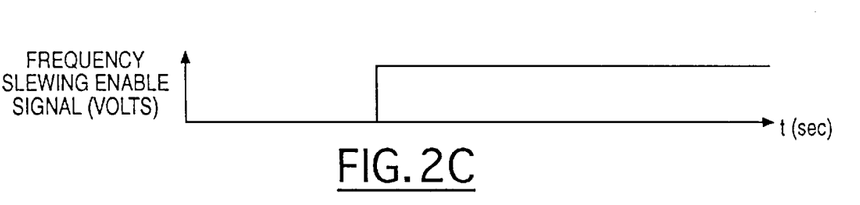

Before preceding to a description of PLL 12 referenced to the drawings, a detailed description of the control established by the embodiment illustrated in FIG. 1 will be set forth. Referring now to FIGS. 2A–2E, FIG. 2B shows an exemplary voltage-versus-time graph of the rise and stabilization of the power supply output. The rise portion is shown as interval A, and is referred to herein as the "power up" or "power on" interval. During this interval, as shown in FIG. 2A, PLL 12 output reference signal is, for practical purposes, unknown. As shown in FIG. 2C, the frequency-slewing enable signal generated by lock detector 14 is at a logic low state, indicating that frequency-slewing mode of PLL 12 has been disabled. Defeat of the frequency-slewing mode is ensured due to the POR signal being in a logic low state, as shown in FIG. 2E. During the power up interval, the phase error associated with PLL 12 is undefined.

Once power-on-reset circuit 16 determines that the power supply has met preselected criteria (e.g., output level, stability, etc.), the POR signal will transition from a logic low state, to a logic state high, indicated at B. It should be appreciated that the POR signal is generated because PLL 18 of circuit 16 has achieved lock, as detected and indicated by lock detector 20, in a manner known to those of ordinary skill in the art. At time B, the frequency-slewing enable signal generated by detector 14 is still at a logic low (i.e., frequency-slewing mode is off) because the amount of phase error, as illustrated in FIG. 2D, is outside of the predetermined, acceptable, phase error margin.

Between time B, and the beginning of interval C, PLL 12 is in a non-slewing mode, since the slewing enable is at a logic low. Accordingly, during this interval, PLL 12 attempts to achieve lock as quickly as the particular PLL design permits, having due regard for the plurality of design considerations considered pertinent by those of ordinary skill in the art, including, but not limited to, loop bandwidth, and gain. Note the rapid reduction in the magnitude of the phase error, as shown in FIG. 2D, between time B, and the beginning of interval C.

Figure 2D:
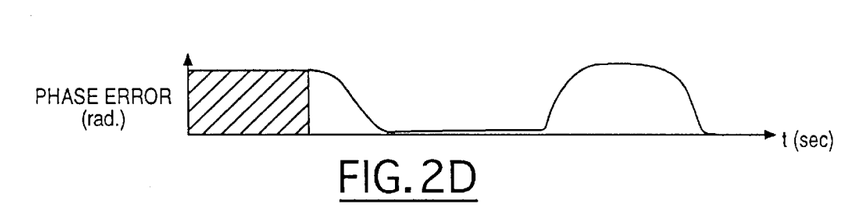
Figure 2E:
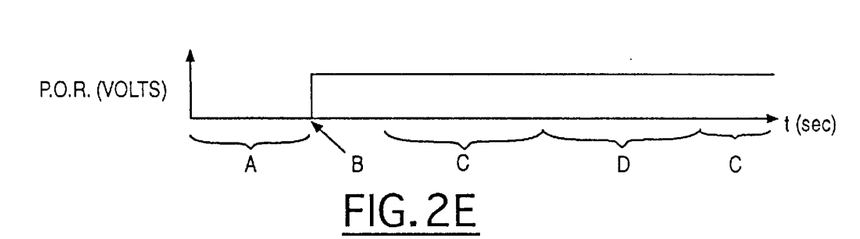

When the phase error has been reduced to an acceptable level, which is illustrated in FIG. 2D as being near zero, lock detector 14, being "armed" to assert the frequency-slewing enable signal by the prior assertion of the POR signal, does assert the frequency-slewing enable signal, as shown in FIG. 2C. At this point, PLL 12 output reference signal has a frequency of $F_1$, as shown in FIG. 2A. The PLL 12 is phase-locked, as shown by the relatively small phase error (FIG. 2D), and the enable signal, accordingly, is asserted (FIG. 2C).

Although there are various methods for frequency-slewing, in one methodology, frequency-slewing is initiated by "stepping" the PLL input reference signal between frequencies. This stepping of input frequencies occurs during interval D. During this interval, the PLL 12 output frequency transitions from $F_1$, to $F_2$, in a fairly linear, relatively slow, controlled fashion, as shown as the transition between points 26, and 27 in FIG. 2A. During interval D, the actual phase error is large, as shown in FIG. 2D. However, lock detector 14 does not change the state of the frequency-slewing enable signal, even though the system is not, technically, phase-locked. Ostensibly, the reason for continuing to assert the enable signal to thereby enable frequency-slewing is to achieve one of the objects of the present invention, which is, namely, to allow a controlled transition between output frequencies. If frequency-slewing were disabled, transition would occur much more quickly, and thus defeat an object of the invention. Further, another object of the invention is to maintain the frequency-slewing mode in an enabled state after the power-up interval has elapsed, and to maintain it until the system is powered off. To achieve these and other objects, the PLL 12 includes circuitry, to be described in greater detail below, for ensuring that the gated out-of-lock indicative signal 22, when in the frequency-slewing mode, is generated to indicate lock within the predetermined error margin associated with lock detector 14 to thereby maintain the enable signal in an active state. The concept involved with this structure, in a charge pump-based preferred embodiment, is to limit the excursion of the UP, and DOWN signals (whose pulse width is indicative of the extent to which the PLL is out-of-lock) such that it appears to the lock detector 14 that the PLL 12 is, in-fact, locked. Limiting the UP/DOWN signals also serves to limit the rate at which the output reference signal varies. Conventional clock chips have been observed to power-up in a time span of no less than approximately 50 milliseconds. A clock synthesizer 10 in accordance with the present invention is characterized by a power-up time on the order of approximately 100 microseconds. This improvement provides advantages in systems having low power requirements.

Figure 3:
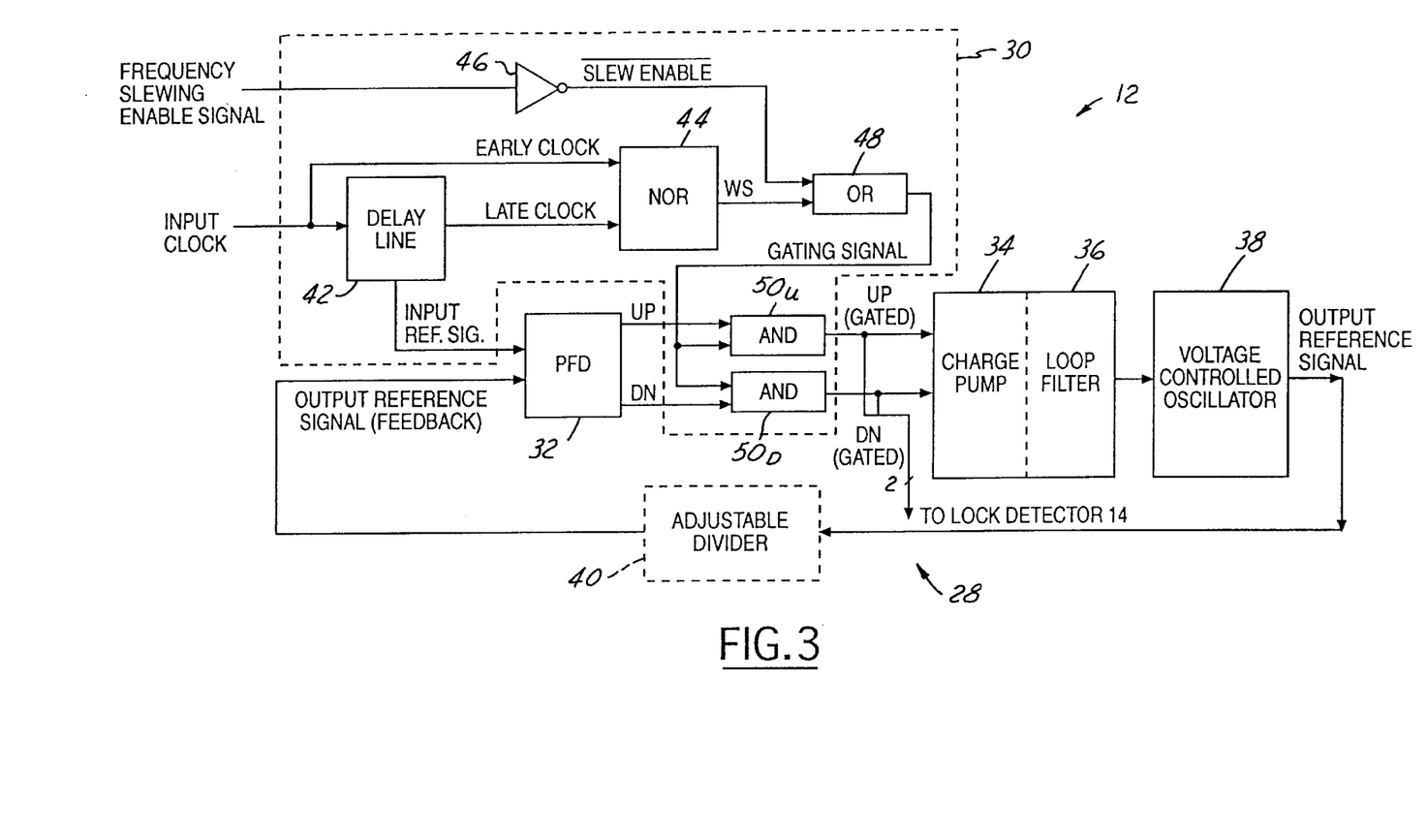
FIG. 3 is a simplified, combined schematic and block diagram view showing, in greater detail, the improved PLL circuit with selectable frequency-slewing mode shown in FIG. 1.

FIG. 3 shows, in greater detail, a preferred embodiment of PLL 12 having a frequency-slewing mode, that is diagrammatically shown in FIG. 1. PLL 12 includes a primary PLL circuit 28, and means, such as gating circuit 30, for generating gated out-of-lock indicative signals UP (gated), and DOWN (gated).

PLL portion 28 includes a phase/frequency detector 32, a charge pump 34, a loop filter 36, a voltage-controlled oscillator 38, and, optionally, an adjustable divider/scaler 40.

Phase/frequency detector (PFD) 32 is conventional in the art, and is responsive to the input reference signal, and the output reference signal (as fed back through divider 40 to define a feedback signal: hereinafter the "feedback signal"). As discussed in the Background section, PFD 32 is provided for generating at least one, and preferably a plurality of actual out-of-lock indicative signals corresponding to whether the feedback signal is phase-locked with the input reference signal, and, indicating the extent to which the feedback signal is out-of-lock relative to the input reference signal. In the illustrated embodiment, the out-of-lock indicative signals are the well-known UP, and DOWN signals.

Charge pump 34 is responsive to the gated out-of-lock indicative signals, hereinafter the UP (gated) and DOWN (gated) signals, for generating a control signal whose voltage potential corresponds to an (indicated) phase error between the feedback signal and the input reference signal. Charge pump 34 is conventional in the art, and may take any of a plurality of well-known forms.

Loop filter 36 is coupled to charge pump 34 and is provided for amplifying, and shaping the transfer characteristic of the generated control signal. The loop filter 36 generally may take the form of a low-pass filter, and outputs a modified control signal having a voltage potential corresponding to the above-mentioned phase error, as modified.

Oscillator 38, which may be a voltage-controlled oscillator (VCO) 38, is controlled in accordance with the modified control signal generated by loop filter 36, and is operative to generate the output reference signal. VCO 38 is conventional in the art, and may take any one of a plurality of well-known forms. Charge pump 34, loop filter 36, and VCO 38 thus form the means for generating the output reference signal according to the gated UP and DOWN out-of-lock indicative signals.

Adjustable divider 40 is optionally included in the PLL portion 28 of circuit 12. Divider 40 may be a simple counter, and is included in PLL 12 to increase the frequency of the output reference signal in accordance with design principles known to one of ordinary skill in the art.

Gating circuit 30 is responsive to the actual out-of-lock indicative signals (i.e., the UP, and DOWN signals) for generating the gated out-of-lock indicative signals, UP (gated), and DOWN (gated). In the non-slewing mode of operation, the UP (gated), and DOWN (gated) out-of-lock indicative signals correspond to the ungated, actual out-of-lock indicative signals (i.e., they are passed through directly, retaining all information inhering therein). When in the frequency-slewing mode of operation, however, the gated signals correspond to the ungated out-of-lock indicative signals, modified, according to predetermined strategy so as to limit the rate at which the output reference signal varies. Circuit 30 includes delay line 42, NOR gate 44, inverter gate 46, OR gate 48, and AND gates $50_U$, and $50_D$. It should be appreciated that the delay lines/gates illustrated in FIG. 3 are exemplary only and not limiting in nature; other variations performing the same or similar logical functions (e.g., by application of DeMorgan's Theorem) are within the spirit and scope of this invention.

Delay line 42, and NOR gate 44 provide the means for generating a reference window signal WS about the input reference signal, using an input clock signal. Delay line 42, and NOR gate 44 are conventional in the art, and provide their well-known functions. It should be appreciated that window signal WS provides periodic positive-going pulses for a purpose to be described hereinafter.

Inverter 46 is conventional, and provides its well-known function to generate an inverted slew enable signal.

OR gate 48 is also conventional, and provides its well-known function of combining the $\overline{\text{slew enable}}$, and the WS signals to generate a gating signal to AND gates $50_U$, and $50_D$.

Figure 4A:
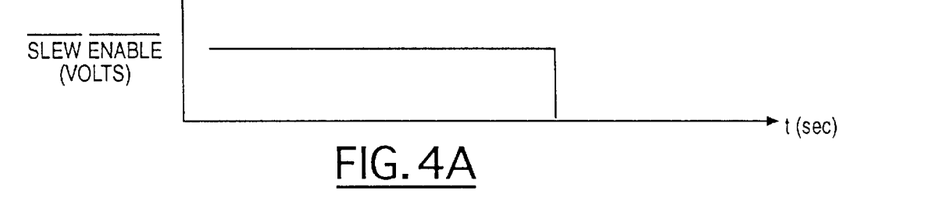
FIGS. 4A–4E are simplified timing diagram views illustrating the windowing technique implemented by the embodiment shown in FIG. 3.
Figure 4B:
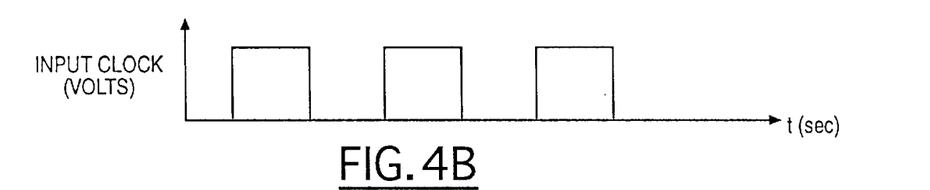
Figure 4C:
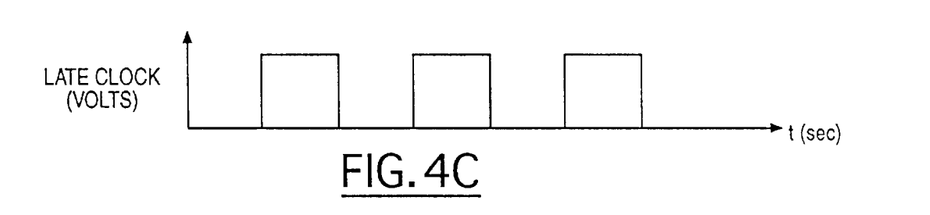
Figure 4D:
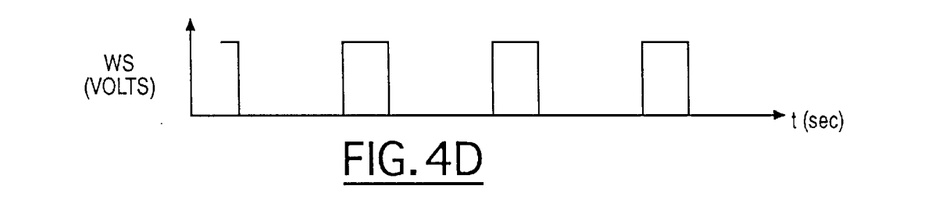

Referring now to FIGS. 4A–4E, a timing diagram is illustrated to more clearly set forth the operation of the circuit shown in FIG. 3. FIGS. 4B–4D show the generation of the reference window signal WS. It should be appreciated that the window signal WS is being generated independent of the frequency-slewing enable signal.

Figure 4E:
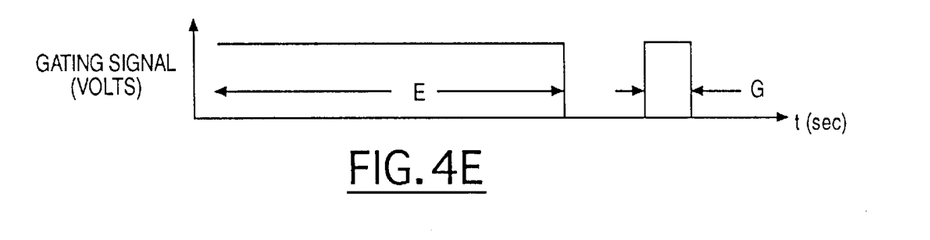

Referring now to FIGS. 4A, and 4E, when the frequency-slewing mode enable signal is off (i.e., frequency-slewing is disabled), the PLL 12 is in a non-slewing mode. During interval E, the gating signal is at a logic high wherein AND gate $50_U$, and $50_D$ are conditioned to pass the UP, and DOWN signals directly through to generate the UP (gated), and DOWN (gated) signals respectively. Thus, the structure 30 is operative for passing the actual out-of-lock indicative signals (i.e., UP, and DOWN) to the output reference signal generator (i.e., comprising components 34, 36, and 38). Since the signals are unmodified, their pulse width's are indicative of the actual extent to which the PLL 12 is out-of-lock; accordingly, the charge pump 34/loop filter 36, and VCO 38 will respond accordingly to bring the output reference signal into phase lock. In this non-slewing mode, rapid frequency variations in the output reference signal may be made.

Once the frequency-slewing mode enable signal is asserted, the gating signal, as shown in FIG. 4E, tracks the reference window signal WS. In this case, the generation by PFD 32 of the UP, and DOWN signals are coordinated in time with the generation of the gating signal such that, beyond a predetermined level, the UP, and DOWN signals from PFD 32 are limited, or truncated to an excursion of no more than the width of the gating signal. Thus, structure 30, when in the frequency-slewing mode, provides the means for limiting the UP, and DOWN signals according to a predetermined strategy such that, the gated UP, and DOWN signals have at least two characteristics: (1) the signals are of such a pulse width so as to indicate phase lock within the predetermined error margin that is being looked for by lock detector 14, to thereby maintain the enable signal in an active state, and, (2) to limit the rate at which the output reference signal varies. The predetermined strategy may include such factors as, for example, how quickly circuits driven downstream by clock generator 10 can track frequency changes. Since the frequency-slewing enable signal changes the gating characteristics of AND gates $50_U$, and $50_D$, the AND gates $50_U$, and $50_D$ are, in effect, operable to select one of the non-slewing, and frequency-slewing modes of operation. Of course, other circuitry may be employed to effect the same results, which are within the spirit and scope of the present invention.

A device in accordance with the present invention provides the capability for self-adjustment to automatically provide a non-slewing mode, during power-up, to effect rapid variations in the frequency of the output reference signal, and, to provide a frequency-slewing mode, during normal operations, to provide the capability for relatively slow, controlled variations in the frequency of the output reference signal in order to prevent loss-of-lock in components being driven downstream by the clock synthesizer 10.

While the invention has been particularly shown and described with reference to the preferred embodiments thereof, it is well understood by those skilled in the art that various changes and modifications can be made in the invention without departing from the spirit and scope of the invention.

I claim:

1. An apparatus for generating an output reference signal using an input reference signal, comprising:

a primary phase-locked loop (PLL) circuit responsive to the input reference signal for generating the output reference signal, said primary PLL circuit including means for generating a first actual out-of-lock indicative signal indicative of the extent to which said primary PLL is out-of-lock;

means responsive to said first actual out-of-lock indicative signal for generating a first gated out-of-lock indicative signal which, when in a non-slewing mode of operation, corresponds to said first actual out-of-lock indicative signal, and, when in a frequency-slewing mode of operation, corresponds to said first actual out-of-lock indicative signal modified according to a predetermined strategy so as to limit a rate at which the output reference signal varies, said first gated out-of-lock indicative signal generating means being selectable for operation in one of said non-slewing and frequency-slewing modes according to an enable signal; and, a primary lock detector circuit for generating said enable signal when said gated out-of-lock indicative signal indicates that said output reference signal is locked to the input reference signal within a first predetermined error margin, said primary lock detector being responsive to a disable signal for disabling said enable signal.

2. The apparatus of claim 1 further comprising a power-on-reset circuit for generating said disable signal during a power-up phase of a power supply until an output of said power supply has reached a preselected level.

3. The apparatus of claim 2 wherein said power-on-reset circuit includes:
   a secondary phase-locked loop (PLL) circuit including means for generating a second actual out-of-lock indicative signal indicative of the extent to which said secondary PLL circuit is out-of-lock;
   a secondary lock detector circuit responsive to said second actual out-of-lock indicative signal for generating said disable signal when said second actual out-of-lock indicative signal indicates that said secondary PLL is locked to within a second predetermined error margin.

4. The apparatus of claim 3 wherein said secondary PLL further includes:
   means responsive to said second actual out-of-lock indicative signal for generating a second gated out-of-lock indicative signal which, when in a non-slewing mode of operation of said secondary PLL, corresponds to said second actual out-of-lock indicative signal, and, when in a frequency-slewing mode of operation of said secondary PLL, corresponds to said second actual out-of-lock indicative signal modified according to a second predetermined strategy.

5. The apparatus of claim 3 wherein said second predetermined error margin is larger than said first predetermined error margin.

6. The apparatus of claim 1 wherein said first actual out-of-lock indicative signal generating means includes a phase/frequency detector.

7. The apparatus of claim 1 wherein said first actual out-of-lock indicative signal comprises an UP signal indicating that the output reference signal lags the input reference signal, and a DOWN signal indicating that the output reference signal leads the input reference signal.

8. The apparatus of claim 1 wherein said first gated out-of-lock indicative signal generating means includes means for generating a reference window signal about the input reference signal, and, an AND gate responsive to said first actual out-of-lock indicative signal and said window signal for restricting said first actual out-of-lock indicative signal to be active within an active portion of said window signal.

9. The apparatus of claim 1 wherein said predetermined strategy includes ensuring that said first gated out-of-lock indicative signal, when in said frequency slewing mode, is generated to indicate lock within said first predetermined error margin to thereby maintain said enable signal in an active state.

10. An apparatus for generating an output reference signal using an input reference signal, comprising:
    a phase/frequency detector responsive to the output and input reference signals for generating an actual out-of-lock indicative signal indicating the extent to which the output reference signal is out-of-lock relative to the input reference signal;
    means responsive to said actual out-of-lock indicative signal for generating a gated out-of-lock indicative signal;
    means for generating the output reference signal according to said gated out-of-lock indicative signal;
    a lock detector for generating a frequency-slewing enable signal when said gated out-of-lock indicative signal indicates that the output reference signal is locked to the input reference signal within a predetermined error margin, said enable signal generating means disabling said enable signal according to a disable signal provided thereto;
    said gated out-of-lock generating means being operative for passing said actual out-of-lock indicative signal to said output reference signal generating means in a non-slewing mode of operation, and for limiting said actual out-of-lock indicative signal in a frequency-slewing mode of operation according to a predetermined strategy such that said gated out-of-lock indicative signal indicates lock within said predetermined error margin to thereby maintain generation of said enable signal by said lock detector, said gated out-of-lock indicative signal generator means being operable in a selected one of said non-slewing and frequency-slewing modes of operation according to said enable signal;
    said means for generating said gated out-of-lock indicative signal being in said non-slewing mode of operation when said disable signal is present wherein said output reference signal is generated using said actual out-of-lock indicative signal to thereby effect fast output reference signal variations;
    said means for generating said gated out-of-lock indicative signal being in said frequency-slewing mode of operation when said enable signal is generated wherein said output reference signal is generated using said gated out-of-lock indicative signal as limited by said predetermined strategy to thereby effect controlled variations of said output reference signal whereby two modes of operation are provided.

11. The apparatus of claim 10 further including a power-on-reset circuit for generating said disable signal during a power-up phase of a power supply until an output of said power supply has reached a preselected level.

12. The apparatus of claim 10 wherein said actual out-of-lock indicative signal comprises an UP signal indicating that the output reference signal lags the input reference signal, and a DOWN signal indicating that the output reference signal leads the input reference signal.

13. The apparatus of claim 10 wherein said gated out-of-lock indicative signal generating means includes an AND gate.

14. The apparatus of claim 10 wherein said output reference signal generating means includes a charge pump for generating a control signal corresponding to a desired output reference signal, and a voltage-controlled oscillator (VCO) responsive to said control signal for generating the output reference signal.

15. The apparatus of claim 14 wherein said output reference signal generating means further includes a loop filter for filtering said control signal in accordance with a predetermined transfer function.

16. A clock synthesizer device having fast frequency slewing during power-on, comprising:
    a primary phase-locked loop (PLL) circuit responsive to an input reference signal for generating an output reference signal, said primary PLL circuit including means for generating a first actual out-of-lock indicative signal indicative of the extent to which said primary PLL is out-of-lock;
    means responsive to said first actual out-of-lock indicative signal for generating a first gated out-of-lock indicative signal which, when in a non-slewing mode of operation, corresponds to said first actual out-of-lock indicative signal, and, when in a frequency-slewing mode of operation, corresponds to said first actual out-of-lock indicative signal modified according to a predetermined strategy so as to limit a rate at which the output reference signal varies, said first gated out-of-lock indicative signal generating means being selectable for operation in one of said non-slewing and frequency-slewing modes according to an enable signal;

a primary lock detector circuit for generating said enable signal when said gated out-of-lock indicative signal indicates that said output reference signal is locked to the input reference signal within a first predetermined error margin, said primary lock detector being responsive to a power-on-reset signal for disabling generation of said enable signal;

a power-on-reset circuit for generating said power-on-reset signal during a power-up phase of a power supply until an output of said power supply has reached a preselected level, said power-on-reset circuit including a secondary phase-locked loop (PLL) circuit including means for generating a second actual out-of-lock indicative signal indicative of the extent to which said secondary PLL circuit is out-of-lock;

a secondary lock detector circuit responsive to said second actual out-of-lock indicative signal for generating said power-on-reset signal when said second actual out-of-lock indicative signal indicates that said secondary PLL is locked to within a second predetermined error margin.

17. The apparatus of claim 16 wherein said second predetermined error margin is larger than said first predetermined error margin.

18. The apparatus of claim 16 wherein said first predetermined error margin is adjustable.

* * * * *